United States Patent
Takayama et al.

(10) Patent No.: US 6,891,449 B2
(45) Date of Patent: May 10, 2005

(54) ANTENNA DUPLEXER

(75) Inventors: Ryoichi Takayama, Osaka (JP); Tetsuo Kawasaki, Osaka (JP); Yuki Satoh, Osaka (JP); Kozo Murakami, Osaka (JP); Toru Sakuragawa, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 336 days.

(21) Appl. No.: 10/087,275

(22) Filed: Mar. 1, 2002

(65) Prior Publication Data

US 2002/0140519 A1 Oct. 3, 2002

(51) Int. Cl.[7] .............................. H03H 9/72; H03H 9/64
(52) U.S. Cl. .................. 333/133; 333/193; 310/313 B; 310/313 D
(58) Field of Search ......................... 333/133, 193–196; 310/313 R, 313 B, 313 C, 313 D

(56) References Cited

U.S. PATENT DOCUMENTS

| | | | | |
|---|---|---|---|---|
| 5,844,347 A | * | 12/1998 | Takayama et al. | ...... 310/313 R |
| 5,909,156 A | * | 6/1999 | Nishihara et al. | ........... 333/193 |
| 5,949,306 A | * | 9/1999 | Hickernell | ................... 333/195 |
| 5,955,933 A | * | 9/1999 | Nishihara et al. | ........... 333/193 |
| 6,208,223 B1 | * | 3/2001 | Shimamura et al. | ........ 333/193 |

FOREIGN PATENT DOCUMENTS

| | | | | |
|---|---|---|---|---|
| EP | 0 663 721 A1 | * | 7/1995 | |
| EP | 1 030 448 A1 | * | 8/2000 | |
| JP | 6-29779 | * | 2/1994 | ................. 333/193 |
| JP | 6-350307 | * | 12/1994 | |
| JP | 9-116380 | * | 5/1997 | |
| JP | 9-205343 | * | 8/1997 | |
| JP | 10-22767 | * | 1/1998 | |
| JP | 10-256869 | * | 9/1998 | |
| JP | 10-303698 | * | 11/1998 | |
| JP | 11-251871 | * | 9/1999 | |
| JP | 2001-156588 | * | 6/2001 | |

* cited by examiner

*Primary Examiner*—Barbara Summons
(74) *Attorney, Agent, or Firm*—RatnerPrestia

(57) ABSTRACT

An antenna duplexer has a power durability to a signal input from an antenna terminal and has stable characteristics. The antenna duplexer includes an input terminal, a transmission filter including a surface acoustic wave (SAW) filter having an input port connected to the input terminal, a phase shifter having an input port connected to an output port of the transmission filter, a reception filter having an input port connected to an output port of the phase shifter, an output terminal connected to the output port of the reception filter, and an antenna terminal connected between the transmission filter and the phase shifter. The transmission filter has a power durability at the output port of the filter, being equal to or larger than a power durability at the input port of the filter.

26 Claims, 18 Drawing Sheets

FIG. 24

| | SAW Resonator No. | Relative Capacitance | SAW Resonator No. | Relative Capacitance | SAW Resonator No. | Relative Capacitance | SAW Resonator No. | Relative Capacitance | SAW Resonator No. | Relative Capacitance |
|---|---|---|---|---|---|---|---|---|---|---|
| FIG. 6 Comparative Example 1 | 63 | 1 | 64 | 1 | 65 | 1 | 66 | 1 | 67 | 1 |
| FIG. 5 Embodiment 1 | 43 | 1 | 44a 44b | 2 2 | 45a 45b | 2 2 | 46 | 1 | 47 | 1 |
| FIG. 9 Comparative Example 2 | 93 | 1 | 94a 94b | 2 2 | 95 | 1 | 96 | 1 | 97 | 1 |
| FIG. 10 Comparative Example 3 | 103a 103b | 2 2 | 104a 104b | 2 2 | 105 | 1 | 106 | 1 | 107 | 1 |

FIG. 25

|  | Antenna Terminal and Output Terminal Both 50Ω-Terminated | | Antenna Terminal Opened, and Output Terminal 50Ω-Terminated | |
|---|---|---|---|---|
|  | Withstand Voltage (dBm) | Deteriorating SAW Resonator No. | Withstand Voltage (dBm) | Deteriorating SAW Resonator No. |
| FIG. 6 Comparative Example 1 | 32 | 64 | ≤30 | 64 |
| FIG. 5 Embodiment 1 | 36 | 44a | 33 | 45b |
| FIG. 9 Comparative Example 2 | 33 | 96 | 30 | 96 |
| FIG. 10 Comparative Example 3 | 33 | 106 | 30 | 106 |

FIG. 26

|  | SAW Resonator No. | Relative Capacitance | SAW Resonator No. | Relative Capacitance | SAW Resonator No. | Relative Capacitance | SAW Resonator No. | Relative Capacitance | SAW Resonator No. | Relative Capacitance |
|---|---|---|---|---|---|---|---|---|---|---|
| FIG. 17 Comparative Example 5 | 173 | 1 | 174 | 1 | 175 | 1 | 176 | 1 | 177 | 1 |
| FIG. 11 Embodiment 2 | 113a 113b | 2 2 | 114a 114b 114c 114d | 4 4 4 4 | 115a 115b | 2 2 | 116 | 1 | 117 | 1 |
| FIG. 13 Embodiment 3 | 133a 133b | 2 2 | 134a 134b 134c 134d | 4 4 4 4 | 135a 135b 135c | 3 3 3 | 136 | 1 | 137 | 1 |
| FIG. 14 Embodiment 4 | 143a 143b | 2 2 | 144a 144b 144c 144d | 4 4 4 4 | 145a 145b 145c | 3 3 3 | 146 | 1 | 147a 147b | 2 2 |
| FIG. 15 Embodiment 5 | 153a 153b | 2 2 | 154a 154b 154c 154d | 4 4 4 4 | 155a 155b 155c | 3 3 3 | 156a 156b | 2 2 | 157a 157b | 2 2 |
| FIG. 16 Comparative Example 4 | 113a 113b | 2 2 | 114a 114b 114c 114d | 4 4 4 4 | 115a 115b | 2 2 | 116 | 1 | 117 | 1 |

FIG. 27

| | Antenna Terminal 50Ω-Terminated, and Output Terminal 50Ω-Terminated | | Antenna Terminal Opened, and Output Terminal 50Ω-Terminated | |
|---|---|---|---|---|
| | Withstand Voltage (dBm) | Deteriorating SAW Resonator No. | Withstand Voltage (dBm) | Deteriorating SAW Resonator No. |
| FIG. 17 Comparative Example 5 | 28 | 174 | ≤27 | 174 |
| FIG. 11 Embodiment 2 | 33 | 113a | 30 | 115b |
| FIG. 13 Embodiment 3 | 33 | 133a | 31 | 137 |
| FIG. 14 Embodiment 4 | 33 | 143a | 32 | 134d |
| FIG. 15 Embodiment 5 | 33 | 153a | 32 | 154d |
| FIG. 16 Comparative Example 4 | 33 | 113a | 28 | 115d |

FIG. 28

| | Antenna Terminal and Output Terminal Both 50Ω-Terminated | | Antenna Terminal Opened, and Output Terminal 50Ω-Terminated | |
|---|---|---|---|---|
| | Withstand Voltage (dBm) | Deteriorating SAW Resonator No. | Withstand Voltage (dBm) | Deteriorating SAW Resonator No. |
| FIG. 20 Embodiment 6 | 33 | None | 30 | 206 |
| FIG. 21 Embodiment 7 | 33 | None | 31 | 213 |
| FIG. 22 Embodiment 8 | 33 | None | 32 | 226a |
| FIG. 23 Comparative Example 6 | 31 | 236 | 28 | 236 |

ANTENNA DUPLEXER

FIELD OF THE INVENTION

The present invention relates to an antenna duplexer used in wireless communication devices such as portable telephones.

BACKGROUND OF THE INVENTION

In a conventional antenna duplexer, as shown in FIG. 29, a transmission filter 302, a phase shifter 303 (enclosed by dotted line), and a reception filter 304 are connected in this sequence between input and output terminals 301 and 305. And an antenna terminal 306 is connected between the transmission filter 302 and phase shifter 303. As the transmission filter 302, a surface acoustic wave (SAW) filter is used.

The antenna duplexer, upon being used for a portable terminal device, has been attempted to improve only its power durability against a signal input in the transmission filter 302 from the input terminal 301.

When the whip antenna of the portable terminal device, upon being extended completely and contracted completely, matches best in phase with the antenna duplexer. In other situation, for example, the antenna, upon not being extended completely or upon being broken, does not match in phase with the antenna duplexer. In an extreme case, ahead of the antenna terminal of the antenna duplexer may open.

In an antenna duplexer, loss or noise due to transmission signal running into a reception circuit have to be usually suppressed. Therefore, a phase shifter is provided so that the output of the transmission filter, that is, the reception circuit as seen from the antenna terminal may open in the transmission frequency band.

Under the condition that the antenna duplexer does not match in phase with the antenna, a part of an output signal from the output port of the transmission filter is reflected to the transmission filter. When state ahead of the antenna terminal opens, nearly whole the output signal enters from the output port to the transmission filter. In this case, a high-frequency voltage and a high-frequency current of about twice at maximum may be applied to the transmission filter by combination of an input signal and its reflected signal.

Therefore, in an antenna duplexer using a SAW filter as the transmission filter, a largest electric power is applied to a SAW resonator near the output port of the SAW filter. Accordingly, the SAW resonator close to the output port deteriorates.

SUMMARY OF THE INVENTION

An antenna duplexer includes an input terminal, a transmission filter including a surface acoustic wave (SAW) filter having an input port connected to the input terminal, a phase shifter having an input port connected to an output port of the transmission filter, a reception filter having an input port connected to an output port of the phase shifter, an output terminal connected to the output port of the reception filter, and an antenna terminal connected between the transmission filter and the phase shifter. The transmission filter has a power durability at the output port of the transmission filter, being equal to or larger than a power durability at the input port of the transmission filter.

The antenna duplexer is thereby prevented from deterioration the filter due to a transmission signal reflected at the antenna terminal, and thus has a sufficient power durability and stable characteristics against a signal input from the antenna terminal.

BRIEF DESCRIPTION OF THE DRAWINGS

FIG. 24 shows capacitance of the SAW resonator according to embodiment 1.

FIG. 25 shows results of an evaluation of the power durability of the antenna duplexer according to embodiment 1.

FIG. 26 shows a capacitance of the SAW resonator according to embodiments 2 to 5.

FIG. 27 shows results of an evaluation of power durability of the antenna duplexer according to embodiments 2 to 5.

FIG. 28 shows results of an evaluation of power durability of the antenna duplexer according to embodiments 6 to 8.

DESCRIPTION OF THE PREFERRED EMBODIMENTS (Embodiment 1)

In embodiment 1 of the invention, an antenna duplexer of 800 MHz band will be explained (transmission band: 824 MHz to 849 MHz, reception band: 869 MHz to 894 MHz).

Figure 1:
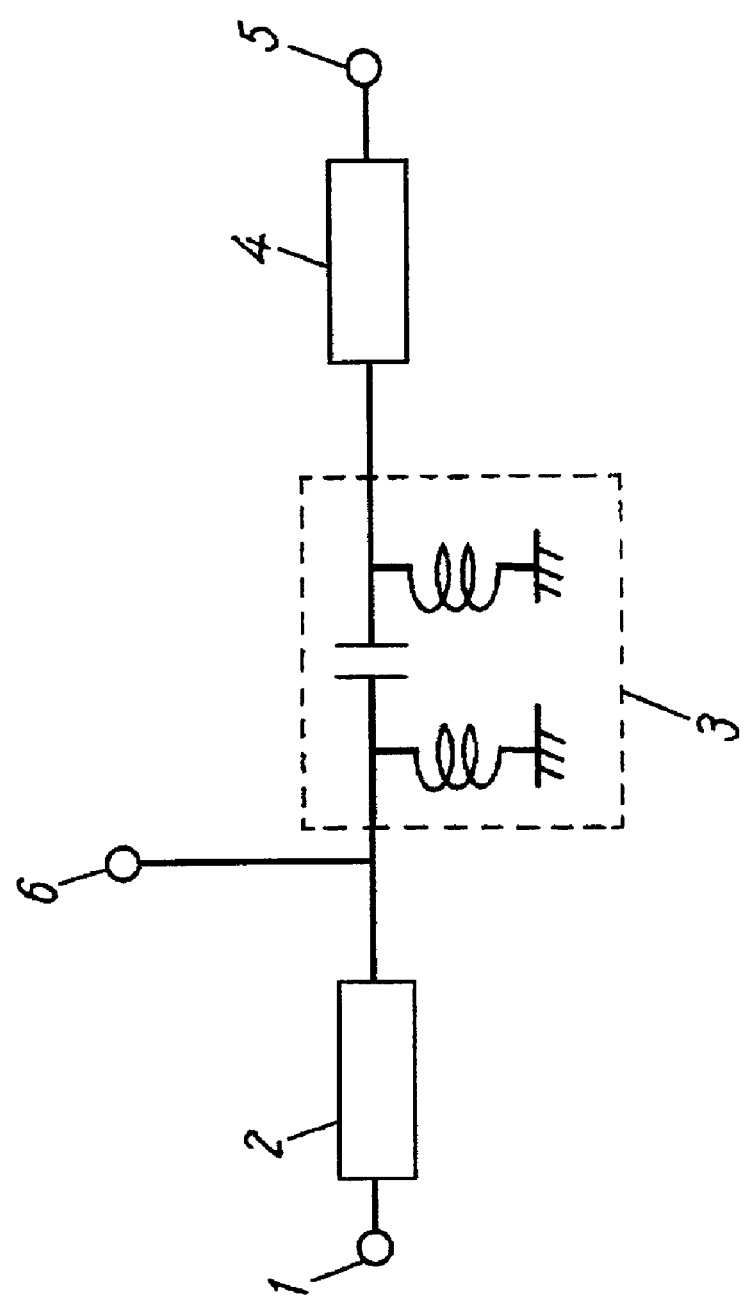
FIG. 1 is a block circuit diagram of an antenna duplexer according to embodiment 1 of the present invention.

FIG. 1 is a block circuit diagram of the antenna duplexer according to embodiment 1. In this antenna duplexer, a transmission filter 2, a phase shifting circuit 3 (enclosed by dotted line), and a reception filter 4 are connected in this order between the input terminal 1 and output terminal 5. An antenna terminal 6 is connected between the transmission filter 2 and phase shifting circuit 3.

Figure 2:
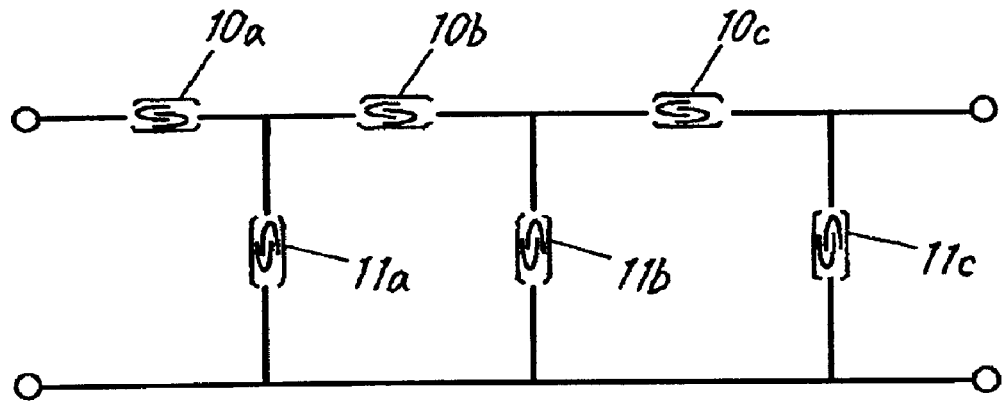
FIG. 2 is a circuit diagram of a reception filter according to embodiment 1.

The reception filter 4 of the antenna duplexer is, as shown in FIG. 2, a ladder type surface acoustic wave (SAW) filter includes SAW resonators 10a, 10b, 10c, 11a, 11b, 11c disposed in series arms and parallel arms, that is, the six SAW resonators consisting of three resonators at respective series arms and three resonators at respective parallel arms. The SAW resonator includes, as shown in FIG. 3, a pair of comb shaped inter-digital transducer (IDT) electrodes 100 on a piezoelectric substrate, and reflector electrodes 101 at both sides of the IDT electrodes.

Figure 4:
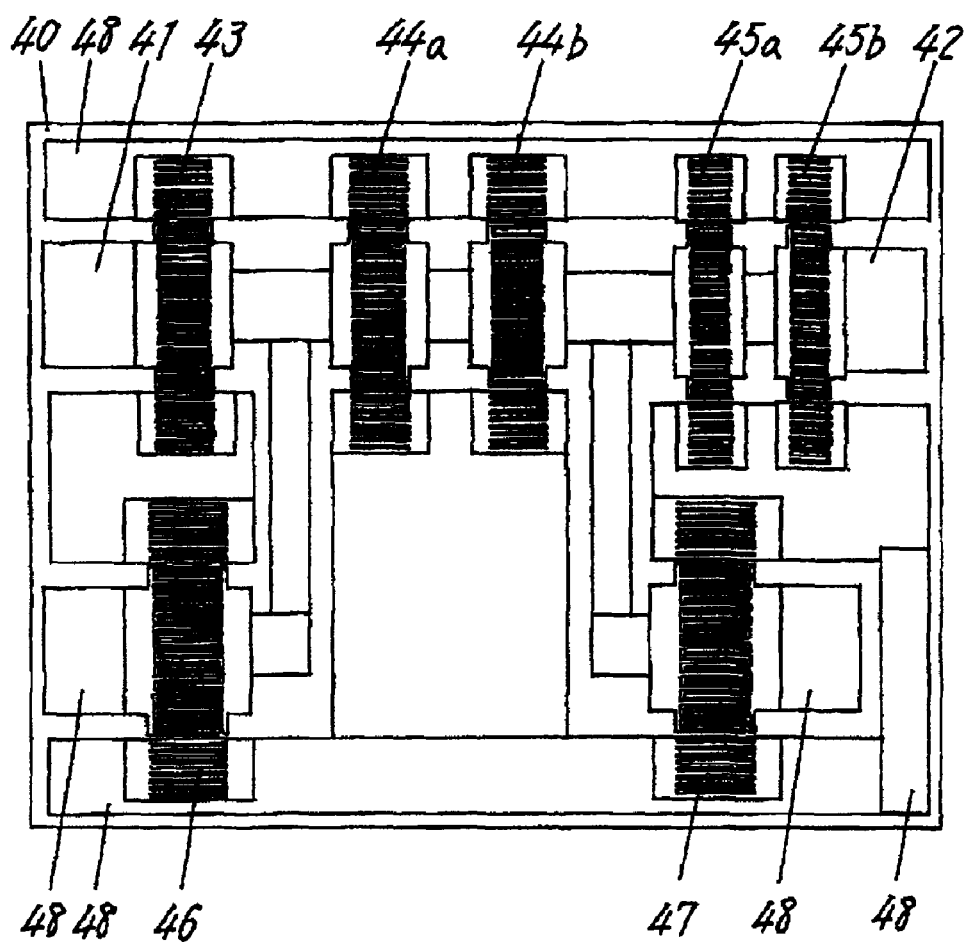
FIG. 4 is a top view of a transmission filter according to embodiment 1.

FIG. 4 is a top view of the SAW filter, the transmission filter 2, of the antenna duplexer according to embodiment 1. The SAW filter includes, as shown in a circuit diagram in FIG. 5, seven SAW resonators consisting of five resonators at respective series arms and two resonators at respective parallel arms. The SAW filter includes a piezoelectric substrate 40, an input electrode 41, an output electrode 42, series arm SAW resonators 43, 44a, 44b, 45a, 45b, parallel arm SAW resonators 46, 47, and a grounding electrode 48.

Figure 3:
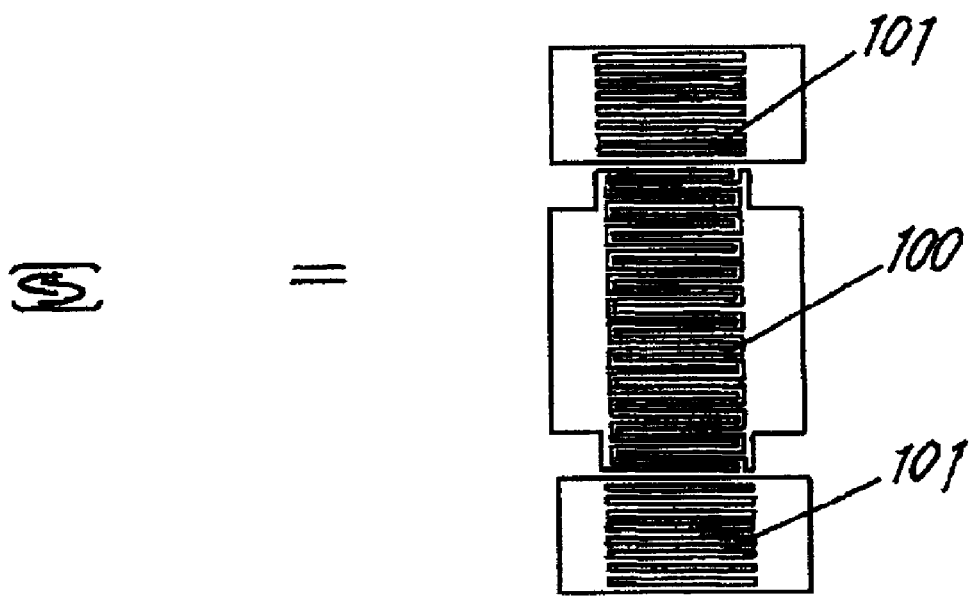
FIG. 3 is a configuration diagram of a surface acoustic wave (SAW) resonator according to embodiments 1 to 8 of the invention.

The SAW resonator composing this SAW filter also include basically, as shown in FIG. 3, a pair of IDT electrodes and reflector electrodes disposed at both sides of the IDT electrodes. The series arm SAW resonators 44a and 44b mutually have an identical structure, and the SAW resonators 45a and 45b have an identical structure.

Figure 6:
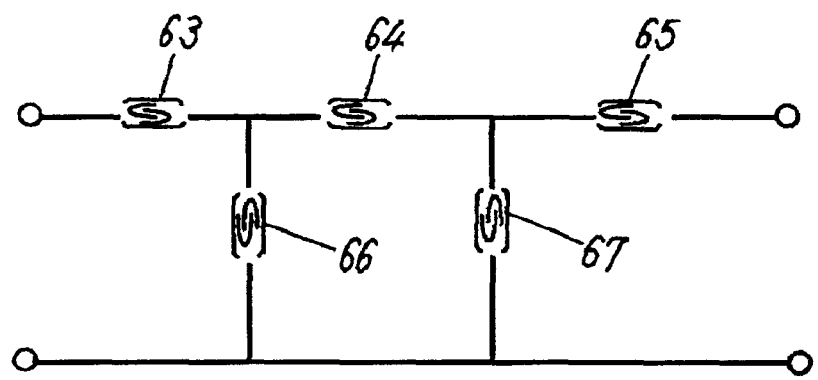
FIG. 6 is a circuit diagram showing a basic structure of a SAW filter according to embodiment 1.
Figure 7:
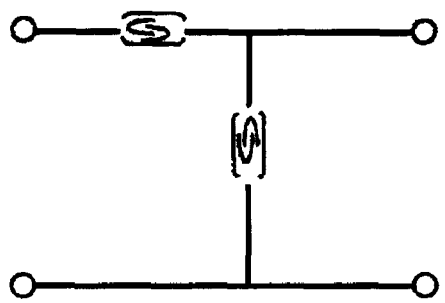
FIG. 7 is a basic circuit diagram of the SAW filter shown in FIG. 6.
Figure 8:
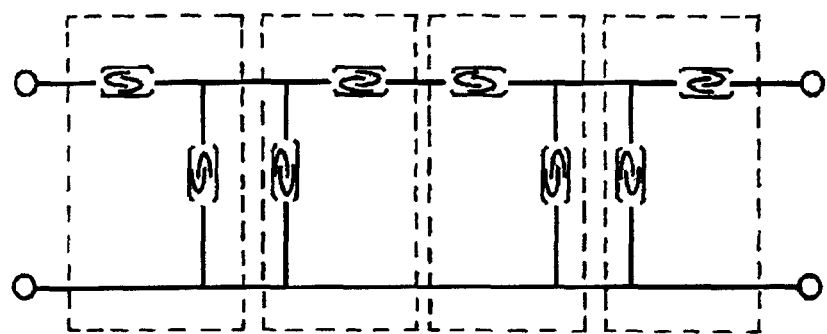
FIG. 8 shows a connection for forming a basic structure shown in FIG. 6 with the circuit shown in FIG. 7.

The basic structure of the SAW filter is shown in FIG. 7. The circuits each including the series arm SAW resonator and the parallel arm SAW resonator shown in FIG. 7 are connected by an image impedance method as shown in FIG. 8. Then, as shown in FIG. 6, parallel arm SAW resonators adjoining to each other and series arm SAW resonators adjoining to each other are combined into respective single SAW resonators. In FIG. 6, a series arm SAW resonator 64 corresponds to the separate series arm SAW resonators 44a and 44b shown in FIG. 4 and FIG. 5. A series arm SAW resonator 65 corresponds to the separate series arm SAW resonators 45a and 45b shown in FIG. 4 and FIG. 5.

Figure 9:
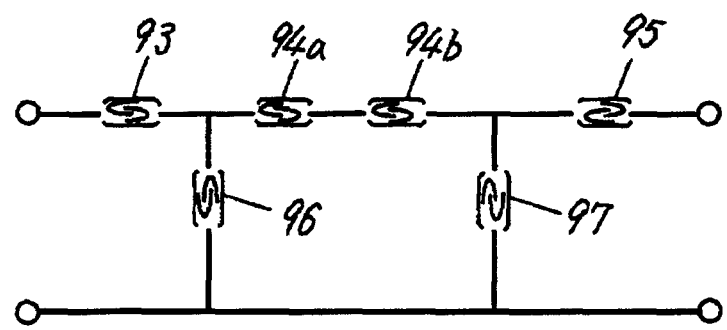
FIG. 9 is a circuit diagram of a SAW filter in comparative example 2.
Figure 10:
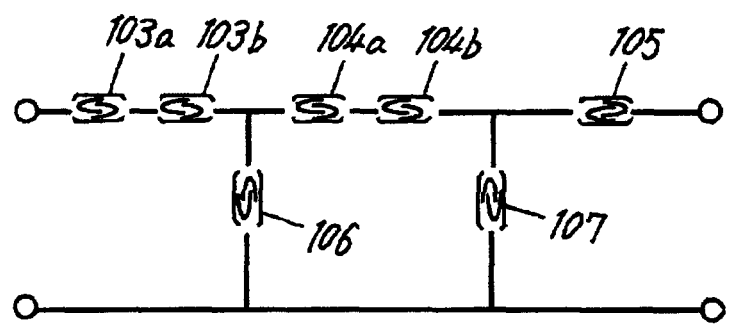
FIG. 10 is a circuit diagram of a SAW filter in comparative example 3.

For comparison, SAW filters shown in FIG. 9 and FIG. 10 are prepared which are equivalent to the SAW filter shown in FIG. 6. The SAW filter shown in FIG. 9 includes separate SAW resonators 94a, 94b corresponding to the series arm SAW resonator 64 of the SAW filter shown in FIG. 6. The SAW filter shown in FIG. 10 has separate SAW resonators 103a, 103b corresponding to the series arm SAW resonator 63 of the SAW filter shown in FIG. 6, and separate SAW resonators 104a, 104b corresponding to the series arm SAW resonator 64.

In order to assure an attenuation amount of the transmission filter in the reception band, the series arm resonators 63, 64, 65, and parallel arm SAW resonators 66, 67 shown in FIG. 6 has respective capacitance C63, C64, C65, C66, and C67 satisfying the following relation.

(C63, C65)>C64

C66=C67

Figure 5:
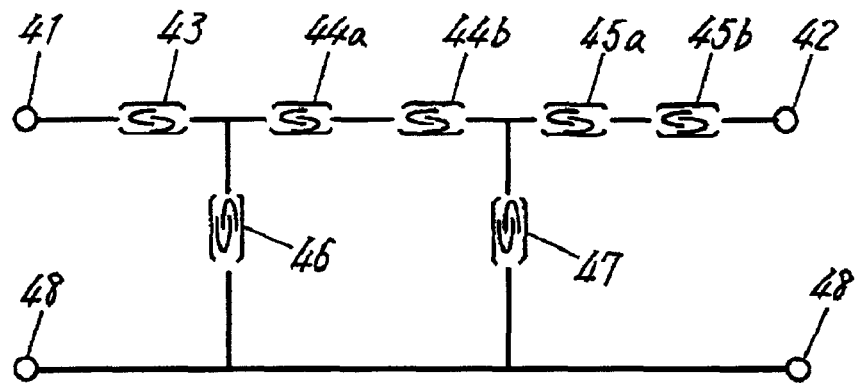
FIG. 5 is a circuit diagram of the transmission filter shown in FIG. 4.

Supposing each capacitance to be a reference (that is, 1), the corresponding series arm and parallel arm SAW resonators in FIG. 5, FIG. 9 and FIG. 10 have respective capacitance shown in FIG. 24.

The aperture length of the SAW resonator shown in FIG. 6 is set to the same aperture length as each of the corresponding separate SAW resonators. In a pair of the IDT electrodes, the number of mutually confronting electrode-finger pairs is set to N times of the number of electrode-finger pairs of SAW resonators disposed at respective N stages. Therefore, each of the separate SAW resonators disposed in N stages has a capacitance of N times of the capacitance of the SAW resonator formed through combining the separate SAW resonators. In FIG. 5, FIG. 9 and FIG. 10, the SAW resonator is divided into two corresponding SAW resonators, and each one of the two resonators has a capacitance of twice of that of the single corresponding resonator.

Therefore, in the SAW filter shown in FIG. 5, the capacitance of the resonators satisfy the following relation.

C43=(C44a, C44b)

(C45a, C45b)>C43=(C44a, C44b)

C46=C47

The SAW filters were evaluated in power durability. Under the condition of the environmental temperature of 85° C. and an applied signal frequency of 849 MHz, if an electric power can be applied more than 100 hours, the SAW filter was evaluated to have a power durability to the applied electric power. In an applied electric power raised gradually from 30 dBm by 1 dBm increment, the power durability was evaluated. Then, the electric power of 1 dBm lower than the applied electric power against which the SAW filter does not withstand for 100 hours was qualified as the power durability of the SAW filter.

The power durability evaluation for the antenna duplexer shown in FIG. 1 was conducted in the following two conditions. One condition is that an electric power was applied to the input terminal 1 with the antenna terminal 6 and output terminal 5 terminated at 50Ω, and other condition is that an electric power was applied to the input terminal 1 with the antenna terminal 6 opening and the output terminal 5 terminated at 500Ω. The results are shown in FIG. 25.

FIG. 25 also shows a SAW resonator exhibiting deterioration of the surface in the SAW filter after the evaluation. The SAW filter of the reception filter 4 did not deteriorate.

FIG. 25 shows that the SAW filter deteriorates at a lower electric power with the antenna terminal 6 opening than with the antenna terminal 6 terminated at 50Ω. In the SAW filter of embodiment 1, the series arm SAW resonators 44a, 44b at the intermediate stage having small capacitance are divided so as to have the same capacitance as the series arm SAW resonator 43 at the first stage from the input terminal 1. And the series arm SAW resonators 45a, 45b at the final stage are divided so as to have a larger capacitance than the series arm SAW resonator 43 at the first stage. This effectively enhances the power durability of the filter as known from comparison with comparative examples 2 and 3.

As known particularly from comparative examples 2 and 3, even if the antenna terminal 6 is terminated at 50Ω, in the filter having a power durability determined by the series arm SAW resonators 95, 105 at the final stage, the power durability is not improved through separating the series arm SAW resonator at the input terminal 1 into multiple stages. Further, when the antenna terminal 6 opens, the series arm SAW resonator at the final stage deteriorates at a much lower input electric power.

Therefore, the SAW filter of embodiment 1 has an identical power durability between against a signal entering from the input terminal 1 and against a signal entering from the antenna terminal 6. Or the filter may have a superior power durability against the latter signal. This prevents the transmission filter 2 from deterioration due to a signal reflected at the antenna terminal 6.

(Embodiments 2 to 5)

In embodiments 2 to 5, an antenna duplexer of 1.9 GHz band (transmission band: 1.85 GHz to 1.91 GHz, and reception band: 1.93 GHz to 1.99 GHz) will be explained. The configuration of the antenna duplexers is the same as shown in FIG. 1, and the explanation is omitted.

Also in embodiments 2 to 5, the ladder type surface acoustic wave (SAW) filter shown in FIG. 2 is used as a reception filter 4.

Figure 11:
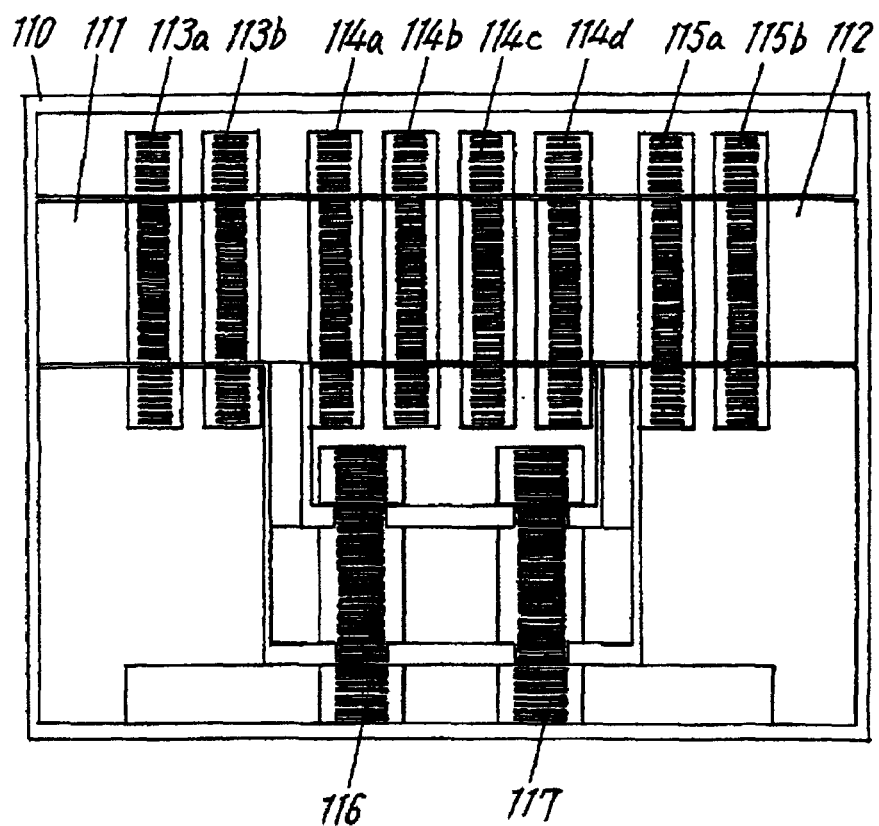
FIG. 11 is a top view of a transmission filter according to embodiment 2 of the invention.
Figure 12:
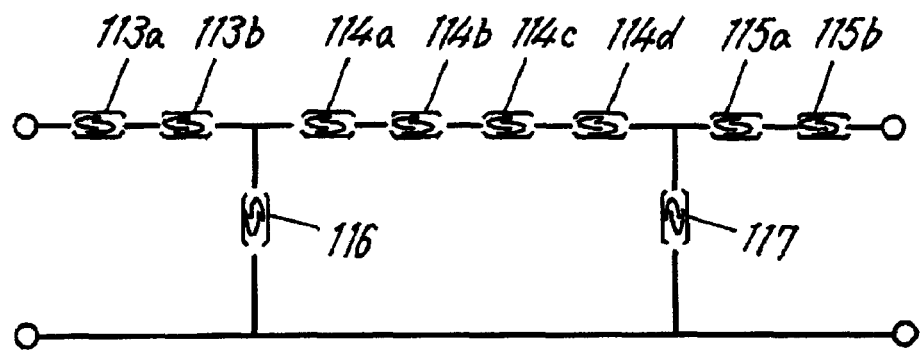
FIG. 12 is a circuit diagram of the transmission filter shown in FIG. 11.
Figure 13:
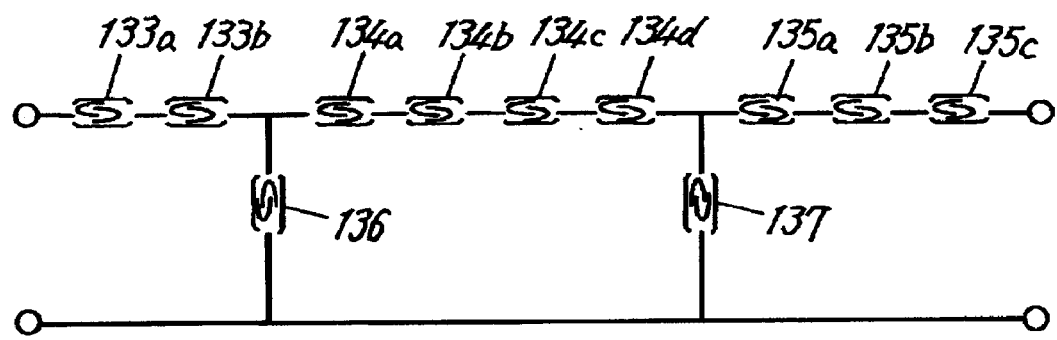
FIG. 13 is a circuit diagram of a transmission filter according to embodiment 3 of the invention.
Figure 14:
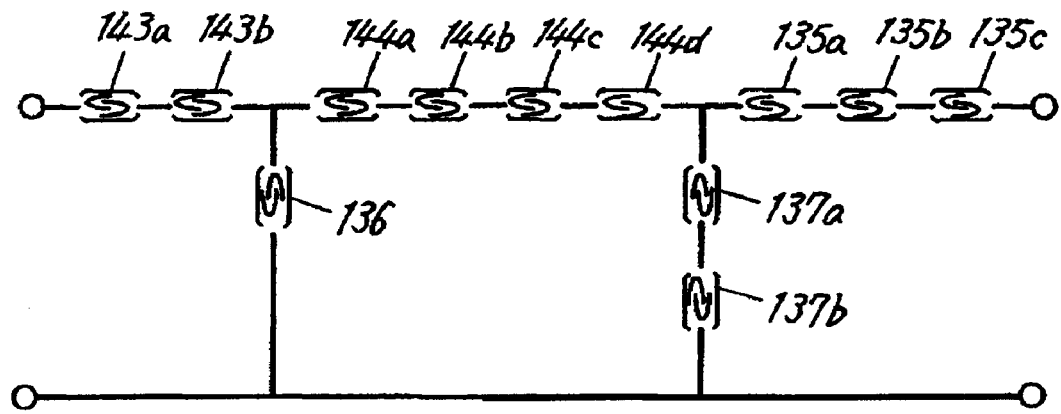
FIG. 14 is a circuit diagram of a transmission filter according to embodiment 4 of the invention.
Figure 15:
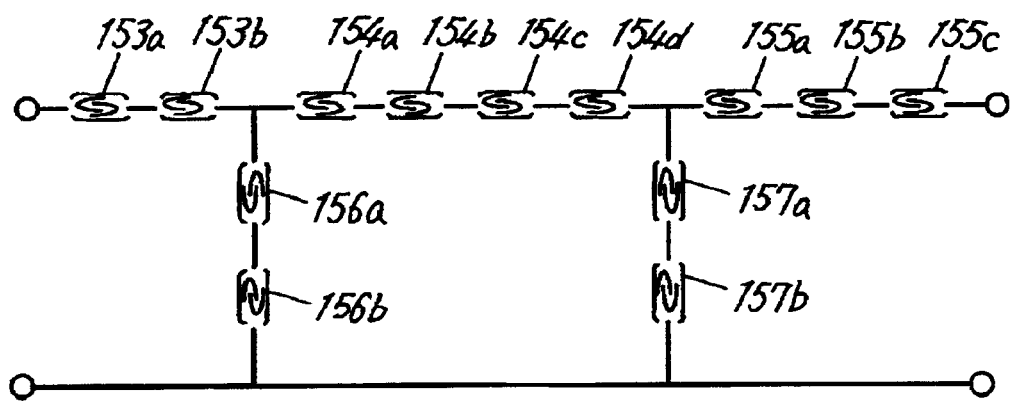
FIG. 15 is a circuit diagram of a transmission filter according to embodiment 5 of the invention.

The transmission filter 2 is a ladder type SAW filter shown in FIG. 12 in embodiment 2, that shown in FIG. 13 in embodiment 3, that shown in FIG. 14 in embodiment 4, and that shown in FIG. 15 in embodiment 5. FIG. 11 shows a layout of the transmission filter on a piezoelectric substrate according to embodiment 2. The filter includes a piezoelectric substrate 110, an input electrode 111, an output electrode 112, series arm SAW resonators 113a, 113b, 114a, 114b, 114c, 114d, 115a, and 115b, and parallel arm SAW resonators 116 and 117.

As known from FIG. 11, the SAW filter has a structure identically seen both from the input electrode 111 toward the output electrode 112 and from the output electrode 112 toward the input electrode 111. That is, the structure is symmetrical on the piezoelectric substrate 110 in arrangement and in circuitry.

Figure 16:
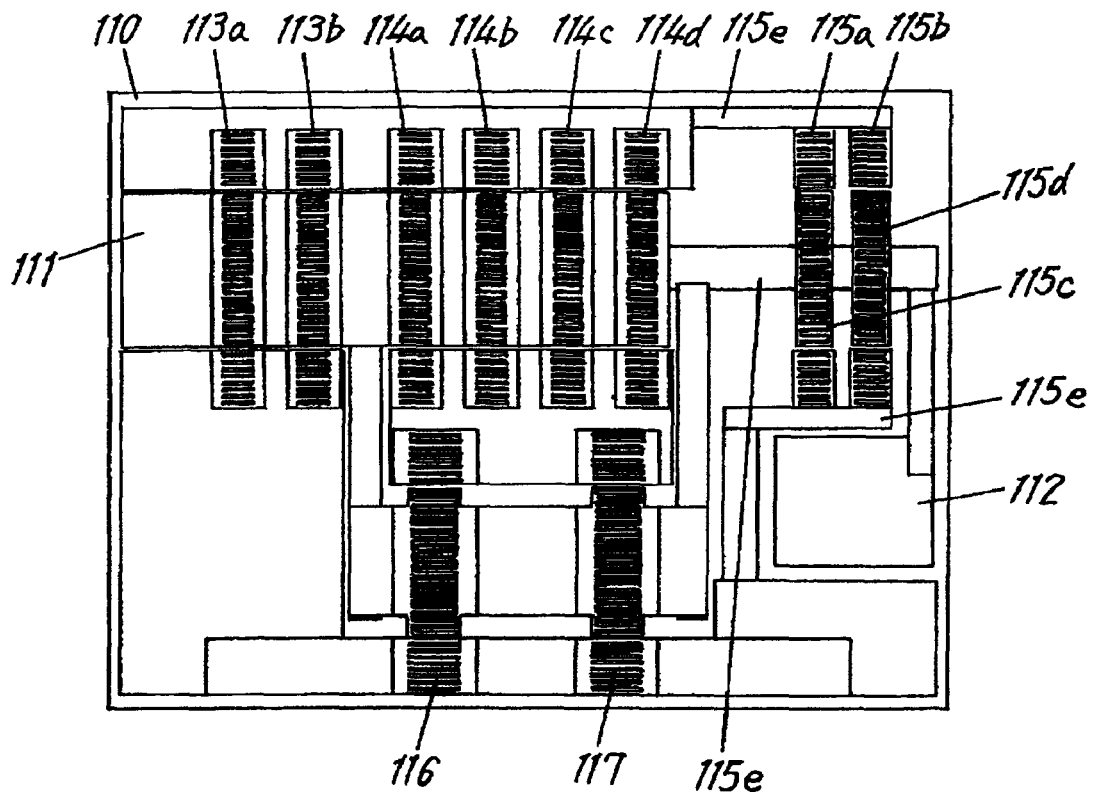
FIG. 16 is a top view of a transmission filter according in comparative example 4.

FIG. 16 shows a comparative example 4, i.e., a SAW filter having the same circuit as that in embodiment 2 but having different arrangement of resonators on the piezoelectric substrate 110. As known from FIG. 16, in comparative example 4, the area of bus bars for IDT electrodes 115c, 115d and pad electrode 115e of series arm SAW resonators 115a, 115b at the output electrode 112 is smaller than those of the other series arm SAW resonators 113a, 113b, 114a to 114d.

Figure 17:
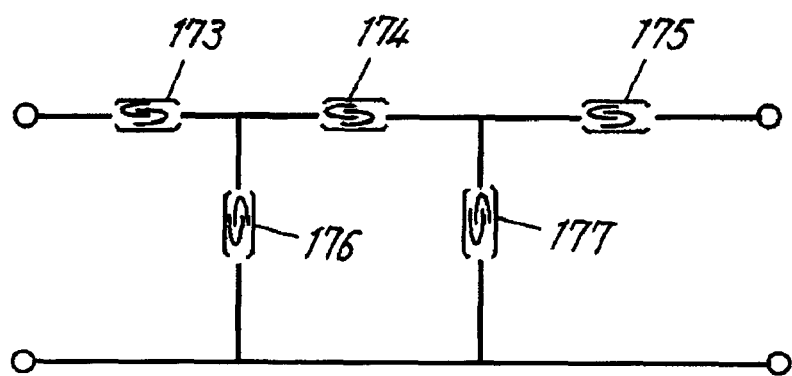
FIG. 17 is a circuit diagram of a transmission filter in comparative example 5.
Figure 18:
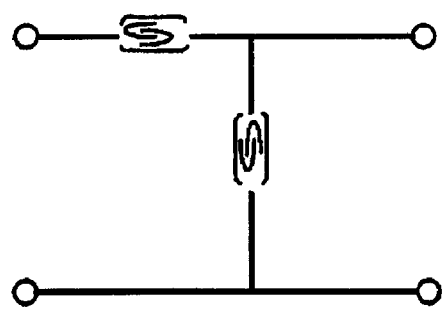
FIG. 18 is a basic circuit diagram of the transmission filter shown in FIG. 7.
Figure 19:
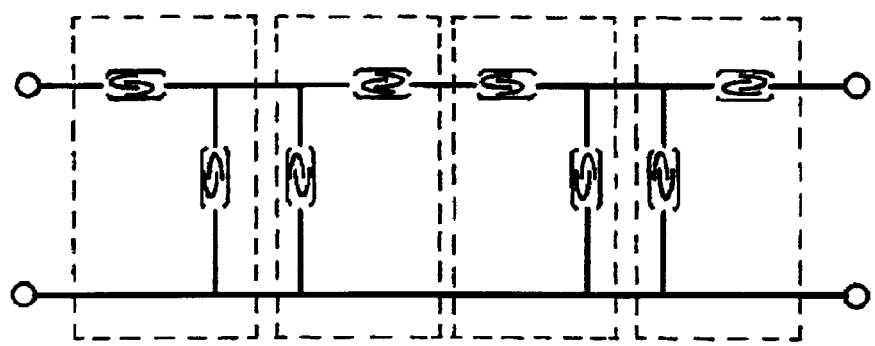
FIG. 19 shows a connection of the basic circuit shown in FIG. 18 for composing the transmission filter shown in FIG. 7.

FIG. 17 shows comparative example 5 of a ladder type SAW filter, that is, the basic filter in the embodiments 2 to 5 and comparative example 4. In this SAW filter, the basic circuit of series arm SAW resonators and parallel arm SAW resonators shown in FIG. 18 is connected according to an image impedance method as shown in FIG. 19. Then, the parallel arm SAW resonators adjoining to each other and series arm SAW resonators adjoining to each other are combined into respective single SAW resonators.

Therefore, in the SAW filter shown in FIG. 17, the SAW resonators 173, 174, 175, 176, and 177 have the respective capacitance C173, C174, C175, C176, and C177 satisfying the following condition.

C173=2×C174
C173=C175>C174
C176=C177

Supposing the capacitance of each SAW resonator in FIG. 17 to be reference (that is, 1), the capacitance of each SAW resonator in the corresponding filters in FIG. 11, FIG. 13 to FIG. 16 is shown in FIG. 26.

In embodiments 2 to 5, similarly to embodiment 1, in the basic SAW filter (FIG. 17), the aperture length of the SAW resonator is set to the same aperture length as each of the separate SAW resonators. In a pair of the IDT electrodes, the number of electrode-finger of the IDT electrodes is set to N times of the number of electrode-finger pairs of SAW resonators disposed at N stages. Therefore, each of the separate SAW resonators disposed at respective N stages has a capacitance of N times of that of the SAW resonator formed through combining the separate SAW resonators.

The SAW filters were evaluated in power durability similarly to embodiment 1. Under the condition of the environmental temperature of 50° C. and an applied signal frequency of 1.91 GHz, an applied electric power gradually raised from 27 dBm by 1 dBm increment. Then, the electric power 1 dBm lower than the applied electric power against which the SAW filter does not satisfy the life of 100 hours was qualified as a power durability of the SAW filter. Results are shown in FIG. 27.

FIG. 27 also shows the SAW resonator exhibiting deterioration of the surface in the SAW filter after the test. The reception filter had no SAW resonator with deteriorate.

FIG. 27 shows that the SAW filter deteriorates at a lower electric power upon the antenna terminal 6 opening than upon the antenna terminal 6 terminated. As clear from comparison between embodiment 2 and comparative example 4, in spite of having an identical circuit, the SAW filter has various power durability if a layout on the piezoelectric substrate is different.

In comparative example 4, the area of bus bar and pad electrodes of series arm SAW resonators 115a, 115b at the final stage, that is, the area of the conductor pattern is smaller than that of the other series arm SAW resonators. Accordingly, heat generated during power feed is released less than that of embodiment 2, and the power durability is considered to decline. That is, in consideration for the release of heat generated during power feed, the filter may be designed to have a symmetrical layout not only in circuit but also in arrangement on the piezoelectric substrate. The design allows the filter to have bias of heat release as little as possible and enhanced power durability. Regarding the layout on the piezoelectric substrate, it is preferred to enhance the heat release efficiency by widening the area of the conductor pattern such as bus bars and pad electrodes connected to the SAW resonators closest to the output terminal 5 or to the SAW resonators deteriorating first. The resonators may accept a larger electric power than the input electric power when the antenna terminal 6 opens.

According to embodiment 3, if the power durability of the series arm SAW resonators is improved, the parallel arm SAW resonators may deteriorate. This is due to discharge between the IDT electrodes of the parallel arm SAW resonators close to the output terminal 5 according to the observation after the test. Combination of the reflected signal and input signal at the antenna terminal 6 allows a larger high-frequency voltage to be applied than a signal input from an input port of the parallel arm SAW resonators with the antenna terminal 6 terminated at 50Ω. It can be considered that discharge takes place between the IDT electrodes of the resonator. Therefore, as in embodiments 4 and 5, separating the parallel arm SAW resonators close to the output terminal 5 allows a divided high-frequency voltage to be applied to each SAW resonator, thus suppressing deterioration of the parallel arm SAW resonator. Therefore, the power durability of the filter with the antenna terminal 6 opening is further enhanced. The power durability is determined based on the series arm SAW resonator usually observed.

(Embodiments 6 to 8)

In embodiments 6 to 8, antenna duplexers of 1.9 GHz band (transmission band: 1.85 GHz to 1.91 GHz, and reception band: 1.93 GHz to 1.99 GHz) will be explained. The configuration of the antenna duplexers is the same as shown in FIG. 1, and the explanation is omitted.

A ladder type surface acoustic wave (SAW) filter of the same configuration as in embodiment 4 is used as a transmission filter 2. The reception filter 3 is a ladder type SAW filter shown in FIG. 20 in embodiment 6, that shown in FIG. 21 in embodiment 7, that shown in FIG. 22 in embodiment 8, and that shown in FIG. 23 in comparative example 6.

Figure 20:
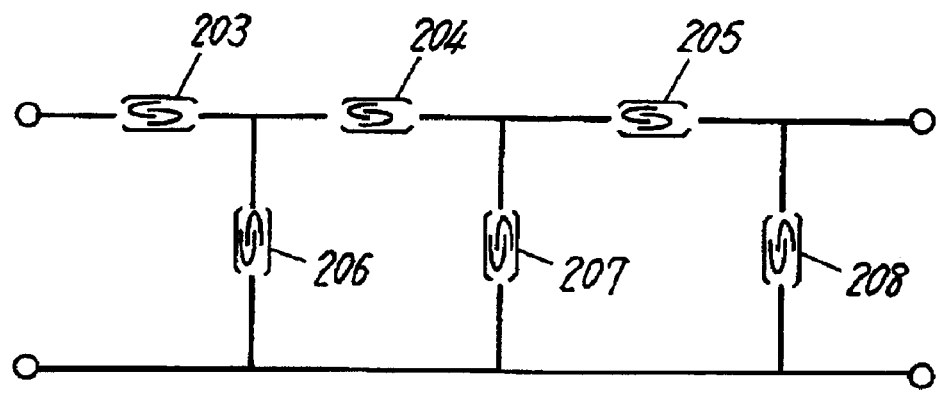
FIG. 20 is a circuit diagram of a reception filter according to embodiment 6 of the invention.
Figure 21:
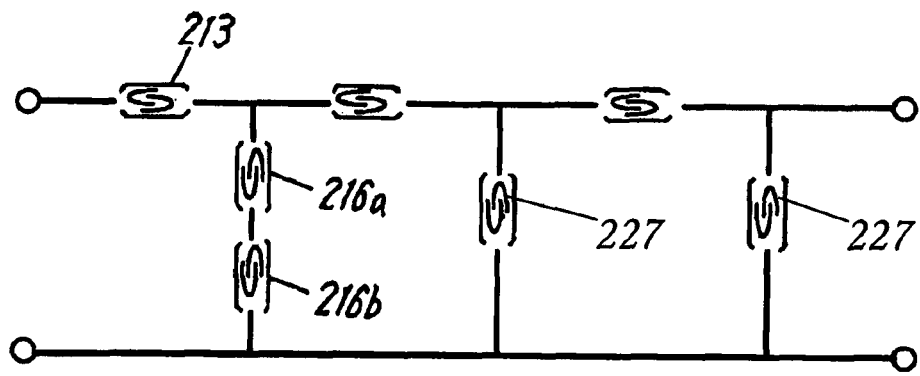
FIG. 21 is a circuit diagram of a reception filter according to embodiment 7 of the invention.
Figure 22:
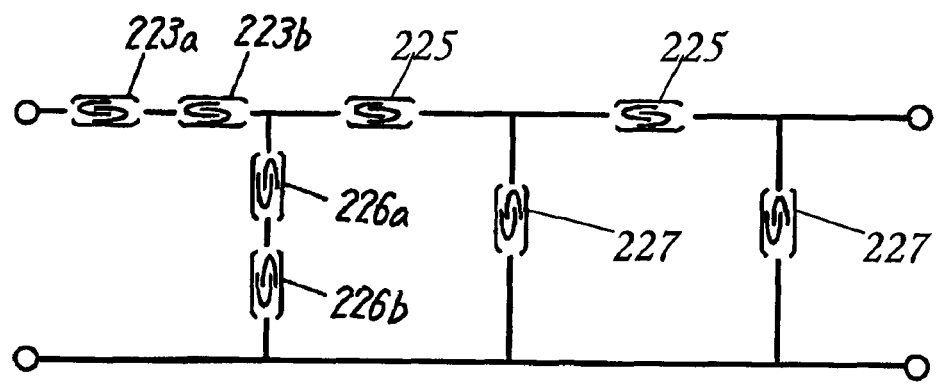
FIG. 22 is a circuit diagram of a reception filter according to embodiment 8 of the invention.

The ladder type SAW filters in FIG. 20 to FIG. 22 include respective series arm SAW resonators 203, 213, 223a at respective first stages from an input terminal 1. On the basis of the SAW filter shown in FIG. 20, in the filter shown in FIG. 21, only the parallel arm SAW resonator closest to the input terminal 1 is divided into two. In the filter in FIG. 22, the series arm SAW resonator closest to the input terminal 1 is divided into series arm SAW resonators 223a, 223b, and the parallel arm SAW resonator closest to the input terminal 1 is divided into parallel arm SAW resonators 226a, 226b.

Figure 23:
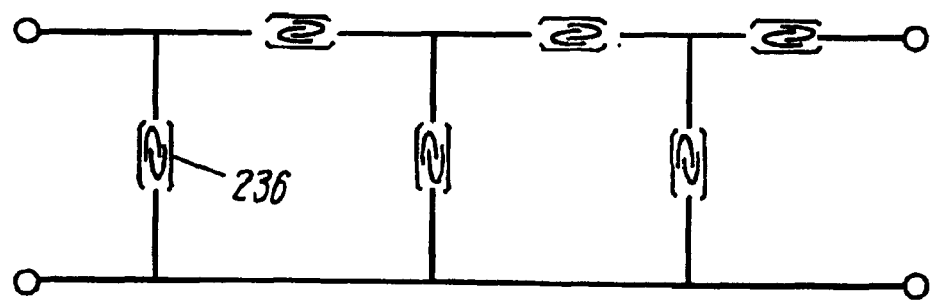
FIG. 23 is a circuit diagram of a reception filter in comparative example 6.
Figure 29:
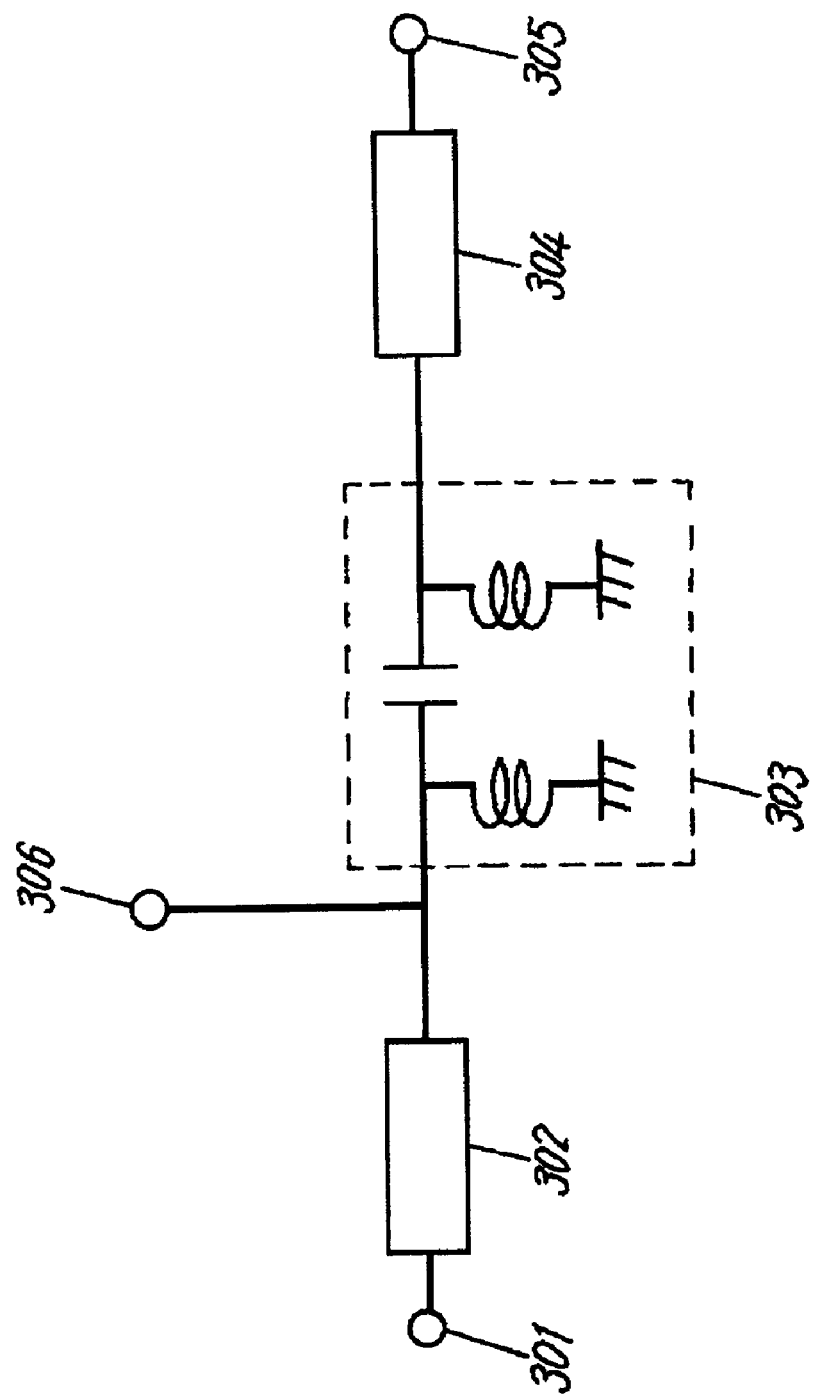
FIG. 29 is a block circuit diagram of a conventional antenna duplexer.

The ladder type SAW filter of comparative example 6 shown in FIG. 23 includes, at the first stage from the input terminal 1, a parallel arm SAW resonator 236. Also in embodiments 7 and 8, the aperture length of the divided series arm SAW resonators 216a, 216b, 223a, 223b, 226a, 226b is set to the same as the series arm SAW resonators 203, 206. The number of electrode-finger pairs of the inter-digital transducer (IDT) of each separate SAW resonator at N respective stages is N times of the number of finger pairs of the resonator being not separated. Therefore, each SAW resonator separated at N stages has a capacitance of N times of the SAW resonator before separation. In embodiments 7 and 8, since the SAW resonator is separated into two, each separate SAW resonator has a capacitance of twice of the resonator before separation.

The SAW filters were evaluated in power durability in a similar test to that in embodiments 2 to 5. Results are shown in FIG. 28.

FIG. 28 also shows the SAW resonator exhibiting deterioration of the surface in the SAW filter after the test. In the test with the antenna terminal 6 opening, the transmission SAW filter did not deteriorate.

As clear from FIG. 28, the reception filter 4, that is, the ladder type SAW filter having series arm SAW resonators 203, 213, 223a at the first stage from the input terminal 1 has a large power durability. This is considered because the transmission power is almost completely reflected at the antenna terminal 6 of the phase shifter 3 in the antenna duplexer having the phase shifter 3. In consideration that the antenna terminal 6 may open, the SAW resonator at the input terminal 1 of the reception filter 4, upon being separated, has an enhanced power durability.

Essential points of the invention will be summarized below.

(1) For preventing the transmission filter from deterioration due to a signal reflected at the antenna terminal 6, the capacity of the series arm SAW resonator having the smallest capacity of the plural divided outermost series arm SAW resonators (closest to the antenna terminal 6) is larger than the capacity of the other series arm SAW resonators. This is achieved with the following relation:

$$Ni \leq Na,$$

where Ni is the number of electrode finger pairs of the IDT electrodes before division of the series arm SAW resonators other than the outermost arm SAW resonator, and Na is the number of finger pairs of each divided SAW resonator. And the following relation:

$$La \leq Li,$$

where Li is an intersecting width of the IDT electrode before the division of the outermost series arm SAW resonator, and La is an intersecting width of the divided SAW resonator, lowers the resistance per electrode comb tooth of the resonator and reduces generated heat.

In consideration of its power durability, series arm SAW resonators positioned closer to the input terminal 1 and output terminal 2 among the series arm SAW resonators for the transmission filter 2 preferably have greater capacitances than other resonators.

(2) The ladder structure SAW filter, upon being used as the transmission filter 2, as shown in FIG. 14 and FIG. 15, has the parallel arm SAW resonator closest to the antenna terminal 6 divided in plural resonators. As a result, in a transmission frequency band, the parallel arm SAW resonator accepting a high voltage has a large power durability and hardly deteriorates. The parallel arm SAW resonator closest to the antenna terminal 6, being divided into plural resonators, has the total capacitance of the resonators being nearly the same as the capacitance before the division. Therefore, the parallel arm SAW resonator hardly deteriorates even if accepting a high-frequency voltage being about twice of a usually-accepting voltage. A parallel arm resonator having the smallest capacitance among the parallel arm resonators into which the parallel arm SAW resonator closest to the antenna terminal is divided has a larger capacitance than the parallel arm SAW resonators other than the divided parallel arm resonator. Therefore, the parallel arm SAW resonator closest to the output port (antenna terminal 6) accepting the largest high-frequency voltage has an enhanced power durability.

(3) The ladder structure SAW filter, upon being used as the reception filter 4, has a series arm SAW resonator at the first stage closest to the antenna terminal 6. The resonator is divided in plural resonators, and the series arm SAW resonator of the smallest capacitance among the plural resonators has a larger capacitance than the other series arm SAW resonators 225 than the divided resonator. As a result, the filter has a enhanced power durability. That is, the following relation is satisfied:

$$Ni \leq Na,$$

where Ni is the number of electrode finger pairs of the IDT electrode before the division, and Na is the number of finger pairs after the division. Further, the following relation reduces the resistance of the electrode comb tooth and thus reduces generated heat:

$$La \leq Li,$$

where Li is the intersecting width of the IDT electrode comb tooth of the resonator before the division, and La is the intersecting width of the tooth of each of the resonators after the division.

The plural SAW resonators after the division are not required to have capacitances or intersecting widths identical to each other.

(4) The ladder structure SAW filter, upon being used as the reception filter 4, as shown in FIG. 21 and FIG. 22, the parallel arm SAW resonator closest to the antenna terminal 6 is divided into plural resonators. As a result, the filter has an enhanced power durability and hardly deteriorates. If the total capacitance of the resonators after the division is nearly the same as the capacitance of the divided resonator, the parallel arm SAW resonator hardly deteriorates even if accepting a high-frequency voltage about twice larger than a usually-accepted voltage. Further, the parallel arm resonator having the smallest capacitance among the plural resonators has a larger capacity than the parallel arm SAW resonator 227 which is not divided. This enhances the power durability of the filter.

(5) The ladder structure SAW filter, upon being used as each of the transmission filter and reception filter, has an identical circuit as seen both from its input port and from its output port, and is more preferably designed to have a symmetrical layout on the piezoelectric substrate. This allows the heat generated during power feed to be efficiently released, and enhances the power durability of the filter.

(6) As described in above, the ladder structure SAW filter is used as the transmission filter and reception filter. This invention provides, with the same effect, another SAW filter, e,g, a lattice structure SAW filter and a partially-cascade-coupled SAW filter having a ladder structure, as far as the filter, e,g, the transmission filter, has respective power durability, at both the input terminal 1 and the antenna terminal 6, identical to each other or the filter has a larger power durability at the antenna terminal 6 than the input terminal 1.

What is claimed is:

1. An antenna duplexer comprising:
   an input terminal;
   a transmission filter including a surface acoustic wave (SAW) filter having an input port connected to said input terminal;
   a phase shifter having an input port connected to an output port of said transmission filter;
   a reception filter having an input port connected to an output port of said phase shifter;
   an output terminal connected to the output port of said reception filter; and
   an antenna terminal connected between said transmission filter and said phase shifter,
   wherein said transmission filter has a power durability at said output port thereof, the power durability being larger than a power durability at said input port thereof.

2. The antenna duplexer of claim 1,
   wherein said SAW filter includes:
   a substrate;
   a SAW resonator disposed on said substrate; and
   a conductor pattern disposed on said the substrate, said conductor pattern being connected to said SAW resonator.

3. The antenna duplexer of claim 1,
   wherein said transmission filter includes a first SAW filter having a first series arm SAW resonator disposed at an outermost arm towards said antenna terminal, and
   wherein said first series arm SAW resonator include a plurality of second series arm SAW resonators connected in series with each other.

4. The antenna duplexer of claim 3,
   wherein the first SAW filter further includes a third series arm SAW resonator, and
   wherein a series arm SAW resonator having a smallest capacitance of said second series arm SAW resonators has a capacity equal to or larger than a capacitance of said third series arm SAW resonator.

5. The antenna duplexer of claim 3,
   wherein said first SAW filter further includes a first parallel arm SAW resonator, and
   wherein said first parallel arm SAW resonator includes a plurality of second parallel arm SAW resonators connected in series with each other.

6. The antenna duplexer of claim 5,
   wherein said first SAW filter further includes a third parallel arm SAW resonator, and
   wherein said first parallel arm SAW resonator is connected closer to said antenna terminal than said third parallel arm SAW resonator.

7. The antenna duplexer of claim 6, wherein a SAW resonator having a smallest capacitance of said second parallel arm SAW resonators has a larger capacitance than said third parallel arm SAW resonator.

8. The antenna duplexer of claim 3, wherein said reception filter includes a second SAW filter including a third series arm SAW resonator disposed at an outermost arm towards said input terminal.

9. The antenna duplexer of claim 8, wherein said third series arm SAW resonator includes a plurality of fourth series arm SAW resonators connected in series with each other.

10. The antenna duplexer of claim 9,
    wherein said second SAW filter further includes a fifth series arm SAW resonator, and
    wherein a SAW resonator having a smallest capacitance of said fourth series arm SAW resonators has a larger capacitance than said fifth series arm SAW resonator.

11. The antenna duplexer of claim 8, wherein said second SAW filter further includes a first parallel arm SAW resonator including a plurality of second parallel arm SAW resonators connected in series with each other.

12. The antenna duplexer of claim 11,
    wherein said second SAW filter further includes a third parallel arm SAW resonator, and
    wherein said first parallel arm SAW resonator is disposed closer to said antenna terminal than said third parallel arm SAW resonator.

13. An antenna duplexer comprising:
    an input terminal;
    a transmission filter including a surface acoustic wave (SAW) filter having an input port connected to said input terminal;
    a phase shifter having an input port connected to an output port of said transmission filter;
    a reception filter having an input port connected to an output port of said phase shifter;
    an output terminal connected to the output port of said reception filter; and
    an antenna terminal connected between said transmission filter and said phase shifter,
    wherein said transmission filter includes a first SAW filter having a first series arm SAW resonator disposed at an outermost arm towards said antenna terminal, and
    wherein said first series arm SAW resonator includes a plurality of second series arm SAW resonators connected in series with each other.

14. The antenna duplexer of claim 13,
    wherein said SAW filter includes:
    a substrate having said plurality of second series arm SAW resonators disposed thereon;
    a plurality of third series arm SAW resonators disposed on said substrate; and a conductor pattern disposed on said substrate, said conductor pattern being connected to at least one of said third series arm SAW resonators and said plurality of second series arm SAW resonators, and wherein a layout of said plurality of second series arm SAW resonators, said third series arm SAW resonators, and said conductor pattern are symmetrical.

15. The antenna duplexer of claim 13, wherein said SAW filter has a circuit being identical as seen both from the input port thereof and from the output port thereof.

16. The antenna duplexer of claim 13, wherein said SAW filter includes:
 a substrate;
 a SAW resonator disposed on said substrate; and
 a conductor pattern disposed on said the substrate, said conductor pattern being connected to said SAW resonator, and wherein a layout of said SAW resonator and conductor pattern is symmetrical.

17. The antenna duplexer of claim 13, wherein the first SAW filter includes a third series arm SAW resonator; and wherein a series arm SAW resonator having a smallest capacitance of said second series arm SAW resonators has a capacity equal to or larger than a capacitance of said third series arm SAW resonator.

18. The antenna duplexer of claim 13, wherein said first SAW filter further includes a first parallel arm SAW resonator, and wherein said first parallel arm SAW resonator includes a plurality of second parallel arm SAW resonators connected in series with each other.

19. The antenna duplexer of claim 18, wherein said first SAW filter further includes a third parallel arm SAW resonator, and wherein said first parallel arm SAW resonator is connected closer to said antenna terminal than said third parallel arm SAW resonator.

20. The antenna duplexer of claim 19, wherein a SAW resonator having a smallest capacitance of said second parallel arm SAW resonators has a larger capacitance than said third parallel arm SAW resonator.

21. The antenna duplexer of claim 13, wherein said reception filter includes a second SAW filter including a third series arm SAW resonator disposed at an outermost arm towards said input terminal.

22. The antenna duplexer of claim 21, wherein said third series arm SAW resonator includes a plurality of fourth series arm SAW resonators connected in series with each other.

23. The antenna duplexer of claim 22, wherein said second SAW filter further includes a fifth series arm SAW resonator; and wherein a SAW resonator having a smallest capacitance of said fourth series arm SAW resonators has a larger capacitance than said fifth series arm SAW resonator.

24. The antenna duplexer of claim 21, wherein said second SAW filter further includes a first parallel arm SAW resonator including a plurality of second parallel arm SAW resonators connected in series with each other.

25. The antenna duplexer of claim 24, wherein said second SAW filter further includes a third parallel arm SAW resonator, and wherein said first parallel arm SAW resonator is disposed closer to said antenna terminal than said third parallel arm SAW resonator.

26. The antenna duplexer of claim 13, wherein said transmission filter has a power durability at said output port thereof, the power durability being equal to or larger than a power durability at said input port thereof.

* * * * *